United States Patent

Imafuku et al.

Patent Number: 5,365,452
Date of Patent: Nov. 15, 1994

[54] PARTS SUPPLY METHOD IN WHICH MOVEMENTS OF PARALLEL SUPPLY TABLES ARE CONTROLLED

[75] Inventors: Shigeki Imafuku, Kadoma; Noriaki Yoshida, Ikeda; Takeshi Takeda, Toyono; Takashi Shimizu, Kishiwada, all of Japan

[73] Assignee: Matsushita Electric Industrial Co., Ltd., Osaka, Japan

[21] Appl. No.: 856,650

[22] Filed: Mar. 24, 1992

[30] Foreign Application Priority Data

Mar. 28, 1991 [JP] Japan .................... 3-064591

[51] Int. Cl.$^5$ ................................ H05K 3/30
[52] U.S. Cl. ........................ 364/468; 29/740
[58] Field of Search ........... 364/468; 29/740, 759, 29/743, 840

[56] References Cited

U.S. PATENT DOCUMENTS

| | | | |
|---|---|---|---|
| 4,681,452 | 7/1987 | Watanabe | 356/375 |
| 4,999,909 | 3/1991 | Eguchi et al. | 29/740 |
| 5,044,069 | 9/1991 | Asai et al. | 29/740 |

*Primary Examiner*—Jerry Smith
*Assistant Examiner*—Cameron H. Tousi
*Attorney, Agent, or Firm*—Wenderoth, Lind & Ponack

[57] ABSTRACT

At least first and second adjacent parts supply tables of a parts supply apparatus are controlled so as to avoid unnecessary movement of a one of the parts supply tables not being used in successive parts supply operations, while at the same time, ensuring that the parts supply tables are sufficiently close to one another at the time of switching over between the parts supply tables to thereby reduce the duration of the switching operation. Alternately, the two parts supply tables are moved together from one position to another to maintain an interval therebetween which allows for a rapid switch-over between the parts supply tables when necessary. However, the rate at which the parts supply table in use is moved is greater than the rate at which the parts supply table not in use is moved, whereby the two parts supply tables come to a rest at different times to thereby reduce impact vibrations.

1 Claim, 6 Drawing Sheets completion for deciding positions of left feed table completion for deciding positions of right feed table 150# PARTS SUPPLY METHOD IN WHICH MOVEMENTS OF PARALLEL SUPPLY TABLES ARE CONTROLLED

BACKGROUND OF THE INVENTION

The present invention generally relates to a parts supply method used in an electronic parts mounting machine or the like, and more particularly, to a parts supply method using a parts supply apparatus provided with a plurality of supply tables adapted to be moved independently.

The conventional parts supply method used in an electronic parts mounting machine for mounting electronic parts to a printed basic plate will be described with reference to FIG. 4, FIG. 5, FIG. 6 and FIG. 7.

FIG. 4 shows one example of an electronic parts mounting machine. The electronic parts mounting machine is composed of a mounting machine main body 1 and a parts supply apparatus 2. The mounting machine main body 1 is composed of a printed basic plate supporting apparatus 3, a rotary mounting head 4 and so on. The parts supply apparatus 2 is composed of a left supply table 6 and a right supply table 7 disposed to be freely moved on a guide rail 5.

A plurality of parts supply units 8 are set respectively on the supply tables 6 and 7, with the electronic parts being loaded on separate parts supply units 8 according to the type of part. The supply tables 6 and 7 are respectively moveable reciprocatingly on a guide rail 5 independently. The supply table 6 or 7 is moved so that the parts supply unit 8 having a required type of electronic parts loaded therein is positioned at a parts supply position 9 so as to effect a parts supply operation, An electronic part is extracted by the rotary mounting head 4 at the parts supply position 9 and is carried to a printed basic plate supporting apparatus 3 by operation of the rotary mounting head 4. Thereafter, the electronic part is mounted onto the printed basic plate.

FIG. 5 illustrates an embodiment of the parts supply apparatus 2. A screw 10 is disposed and secured along its moving direction under the supply tables 6 and 7. A nut portion 11 to be screwed onto the screw shaft 10 and a motor 12 with the nut portion 11 being rotary-driven around the screw shaft 10 are respectively provided.

The motor 12 has a cylindrical rotor 14 disposed in a shape concentric to the screw shaft 10 within a stator 13 secured on the under face of the supply tables 6 and 7, and is rotatably supported through a bearing 15. One end portion of the rotor 14 is coupled to a nut portion 11. Accordingly, the motor 12 rotates the rotor 14 so as to rotate the nut portion 11 so that the supply tables 6 and 7 are respectively reciprocated independently along the guide rail 5.

When numerous types of electronic parts are to be used in the production of the required printed basic plates, the parts supply units 8 are distributed and loaded on both the left supply table 6 and the right supply table 7. In this case, the respective supply tables 6 and 7 must be alternately moved to the parts supply position 9 in accordance with the electronic parts to be mounted. The conventional embodiment of a parts supply method employing the alternate use of such supply tables 6 and 7 will be described next.

A first parts supply method entails moving only a supply table to be used while the other supply tables not used are stopped in respective waiting positions. FIG. 6(a) shows a condition where the left supply table 6 is used. The right supply table 7 not used moves to a waiting position 17 and is in a stop condition until such time the right supply table is used again. FIG. 6(b) shows a condition in which the right supply table 7 is selected for use. The unneeded left supply table 6 moves to a waiting position 16 and enters a stop condition. The right supply table 7 moves to a parts supply position 9.

A second parts supply method entails operating all of the supply tables 6 and 7 similarly regardless of which of the supply tables 6 and 7 is being used. FIG. 7(a) shows a condition where the left supply table 6 has been selected. FIG. 7(b) shows a condition where the right supply table 7 has been selected. In any case, both supply tables 6 and 7 behave as one supply table by moving together the same distance in the same direction while retaining the required interval therebetween.

In the conventional embodiment shown in FIG. 6, the supply table must move from the waiting position to the parts supply position upon selection of the supply table, whereby the parts supply operation is interrupted to thereby waste time and lower productivity. Generally, the waiting position is spaced a sufficient distance from the parts supply position so as to avoid interference with the movement of other supply tables, thus resulting in a large amount of wasted time each time a supply table is made to move across this distance.

In the conventional embodiment of FIG. 7, movement to and from a waiting position is not necessary upon selection of a supply table, thus resulting in a reduced consumption of time when switching over between supplying tables.

However, in contrast to the method of FIG. 6 in which one supply table is to be moved by the supply of the electronic parts, in the method of FIG. 7, two supply tables are moved simultaneously to cause mechanical vibrations during operations of long duration.

Referring again to the parts supply apparatus of FIG. 5, vibrations caused by the driving operations of the motor 12 are transmitted to the screw shaft 10. When the two supply tables 6 and 7 are simultaneously moved, the two motors 12 are simultaneously driven so as to cause large vibrations in the screw shaft 10. The vibrations of the screw shaft 10 are transmitted to the supply tables 6 and 7 mounted thereon so as to vibrate the parts supply unit 8 and the electronic parts loaded therein. As a result, the rotary mounting head 4 suffers a reduced success ratio in the engagement of the parts, which in turn deteriorates the production efficiency by increasing time consumption for the repairs and wasting electronic parts. Also, the electronic parts mounting accuracy is deteriorated due to the vibrations of the entire machine.

SUMMARY OF THE INVENTION

Accordingly, the present invention has been developed with a view to substantially eliminating the above discussed drawbacks inherent in the prior art and has for its essential object to provide an improved parts supply method.

Another important object of the present invention is to provide a parts supply method which is capable of switching between supply tables in a short time period and lowering mechanical vibrations accompanying movement of the supply tables.

In accomplishing these and other objects, according to a first embodiment of the present invention, there is provided a part supply method for controlling a parts supply apparatus having at least adjacent first and second parts supply tables which are spaced apart from each other along a moving direction and which are capable of being moved independently of one another in the moving direction. Each of the first and second parts supply tables is for setting therein a plurality of adjacent parts supply units. The parts supply apparatus further has a drive device for selectively moving each first and second parts supply table in the moving direction so as to position a desired parts supply unit at a parts take out position to permit parts contained in the desired supply unit to be extracted using an extracting mechanism. During each of plural successive parts supply operations of the parts supply apparatus, parts are extracted by the extracting mechanism from a parts supply unit position at the parts take out position by movement of one of the first and second parts supply tables. The parts supply method includes a first step of determining in advance, based on previously prepared parts supply information, a movement of the first parts supply table during a plurality of successive parts supply operations in which parts are respectively extracted from a plurality of parts supply units of only the first parts supply table; a second step of determining in advance a movement of the second parts supply table during the plurality of successive parts supply operations, the second step including (a) determining, for each of the plurality of successive parts supply operations, an interval between a current position of the second parts supply table and a position of the first parts supply table determined in the first step, and (b) setting, for each of the plurality of successive parts supply operations, the position of the second parts supply table so as to obtain a given interval between the first and second parts supply tables when the determined interval between the current position of said second parts supply table and the position of said first parts supply table is less than the given interval, and so as to establish the current position of the second parts supply table as the set position of the second parts supply table when the interval between the current position of the second parts supply table and the first supply table is more than the given internal, wherein an unnecessary movement of the second parts supply table is avoided by establishing the current position of the second pats supply table as the set position of the second parts supply table when the interval between the current position of the second parts supply table and the first supply table is more than the given internal; and a third step of effecting the plurality of successive parts supply operations in accordance with the advance determined movements of the first and second supply tables.

According to a second embodiment of the present invention, there is provided a part supply method for controlling a parts supply apparatus as described above in connection with the first embodiment. The parts supply method of the second embodiment includes a step of moving the first parts supply table so as to position a parts supply unit thereof at the parts take out position; and a step of moving the second parts supply table during movement of the first parts supply table to establish a given interval between the first and second parts supply table when the moving of the first and second parts supply tables is complete; wherein a duration of the moving of the second parts supply table is greater than a duration of the moving of the first parts supply table. The moving of the first parts supply table and the moving of the second parts supply table are commenced at the same time. Also, a maximum speed during the moving of the first parts supply table and a maximum speed during the moving of the second parts supply table is the same, and an acceleration and deceleration to and from the maximum speed during the moving of the first parts supply table is greater than an acceleration and deceleration to and from the maximum speed during the moving of the second parts supply table.

According to the parts supply method of the first embodiment, the supply table used currently in the parts supply operation and the supply table not currently used in the parts supply operation are both moved, and the interval by which the supply tables are spaced apart at the time of switching over between parts supply tables is made narrow so as to effect the switching operation in a short time. Also, according to the present invention, unnecessary movement of a parts supply table not in use is avoided by examining in advance the movement of the supply table which is used to effect the parts supply operation a plurality times in succession after a certain time point. Considering the position of the supply table which is used to effect the parts supply operations and the position of the supply table which is not used to effect the parts supply operation, the moving direction and the moving amount of the respective supply tables are determined. By avoiding unnecessary movement of the supply table which is not used to effect the parts supply operations, the vibrations accompanied by such unnecessary movement are avoided.

According to the parts supply method of the second embodiment, the supply table which is used to effect the parts supply operation and the supplying table which is not used to effect the parts supply operation are both moved so as to retain a short spaced apart interval between the supply tables so that switching between supplying tables can be effected in a short time period. All the supply tables need not be moved at the same time. In the second embodiment, the acceleration accompanied by the movement of the supply table which is not used to effect the parts supply operation is made lower, so that impact vibrations accompanied by acceleration and deceleration of the supply tables can be reduced.

BRIEF DESCRIPTION OF THE DRAWINGS

These and other objects and features of the present invention will become apparent from the following description taken in conjunction with the preferred embodiments thereof with reference to the accompanied drawings, in which.

DETAILED DESCRIPTION OF THE INVENTION

Figure 1:
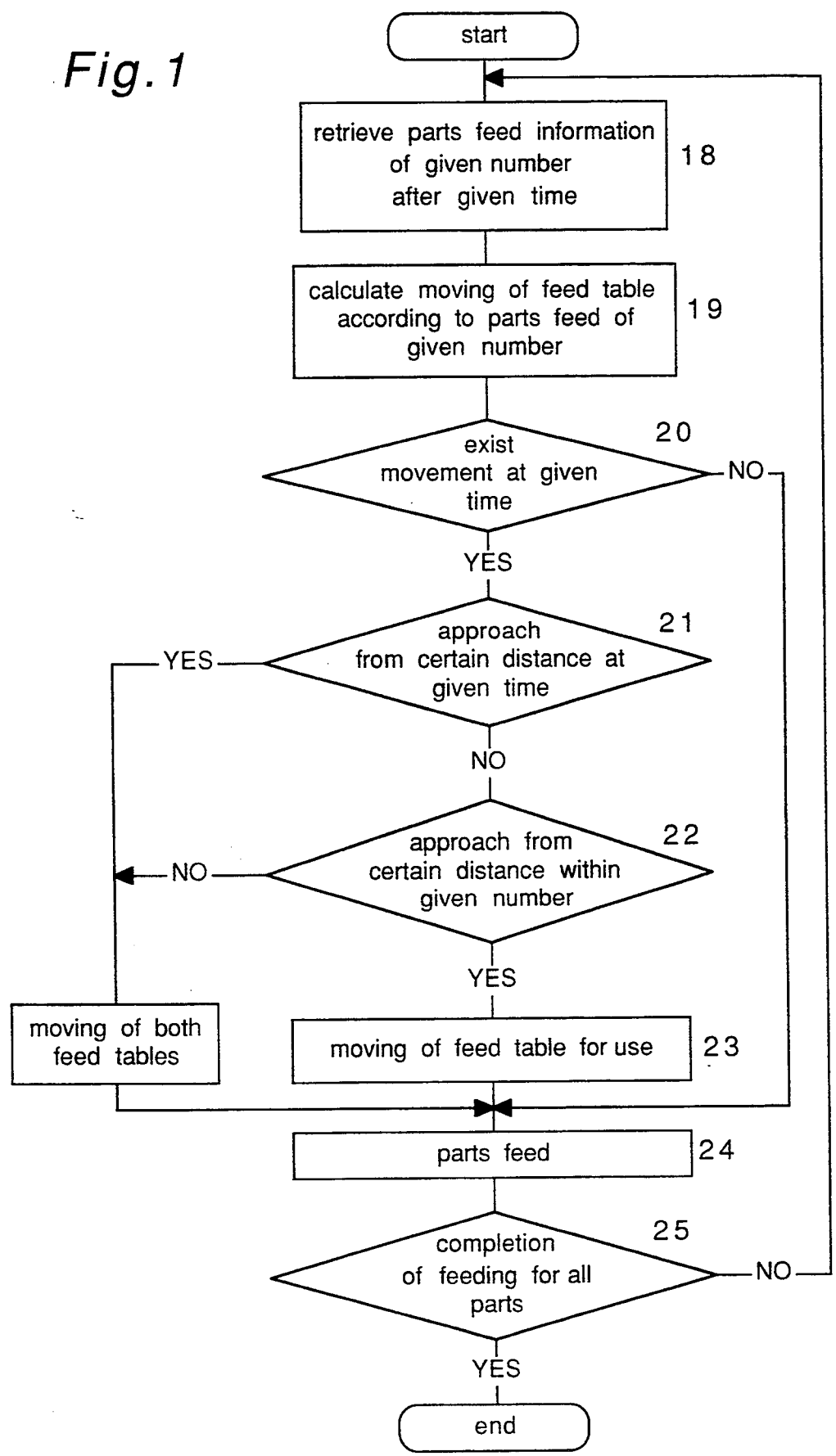
FIG. 1 is a flow chart in a first embodiment of a parts supply method of the present invention.

Before the description of the present invention proceeds, it is to be noted that like parts are designated by like reference numerals throughout the accompanying drawings.

A first embodiment of the parts supply method of the present invention will be described hereinafter with reference to FIG. 1 and FIG. 2.

Figure 4:
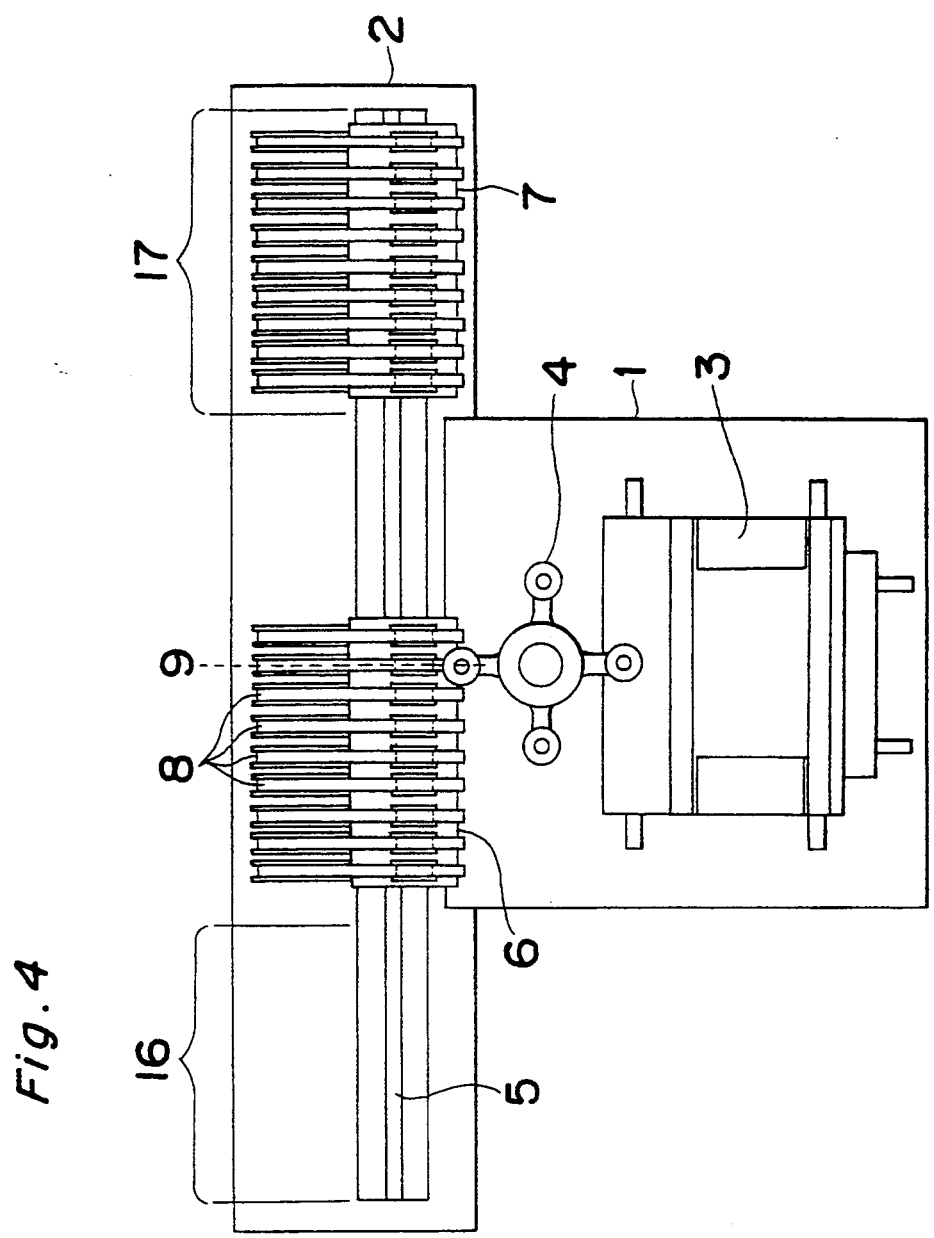
FIG. 4 is a plane view showing the construction of an electronic parts mounting machine.
Figure 5:
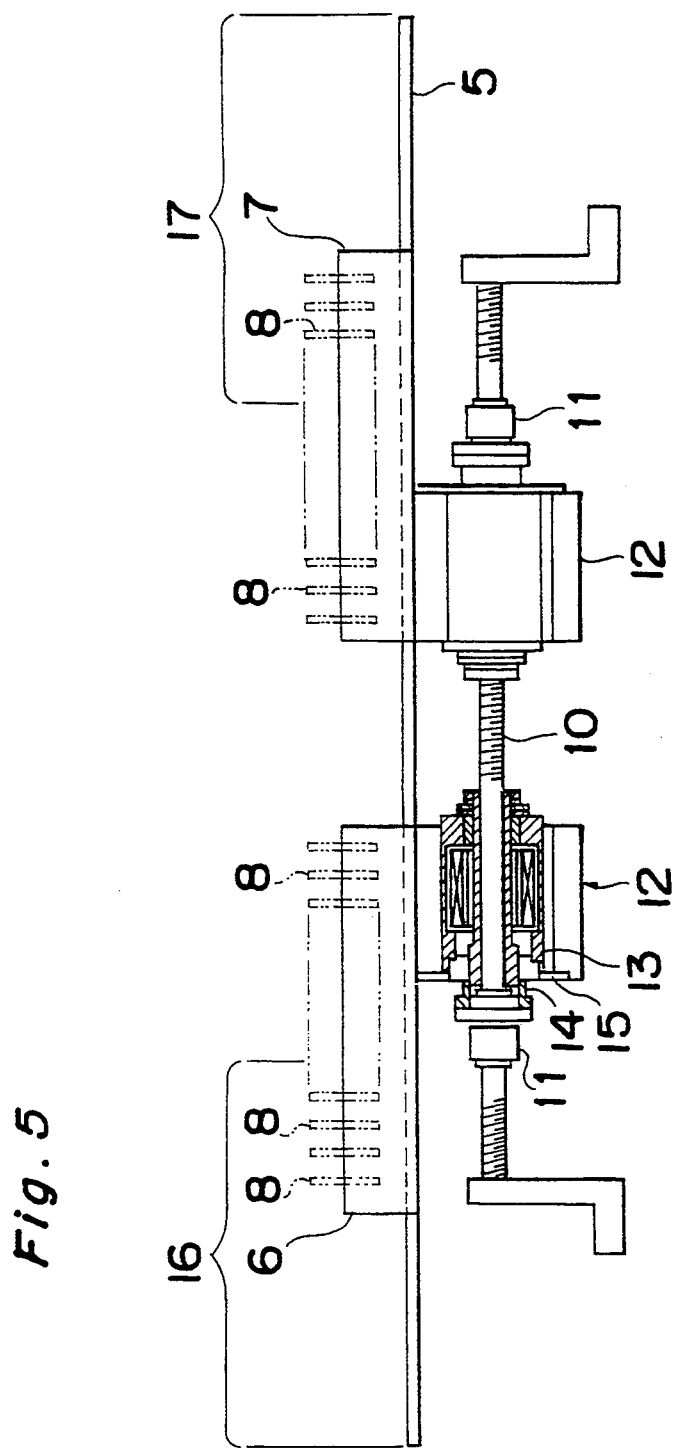
FIG. 5 is a partial sectional front face view showing the construction of a parts supply apparatus.
Figure 6A:
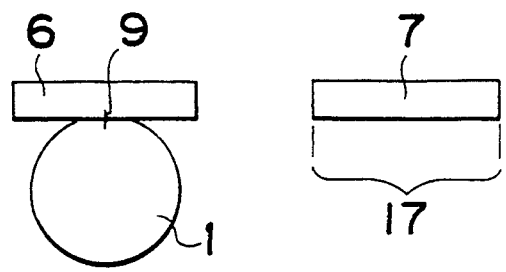
FIGS. 6(a) and 6(b) are views illustrating one embodiment of a conventional parts supply method.
Figure 6B:
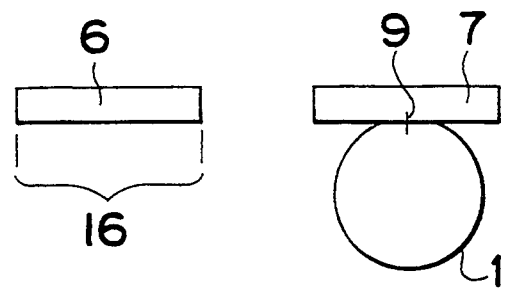
Figure 7A:
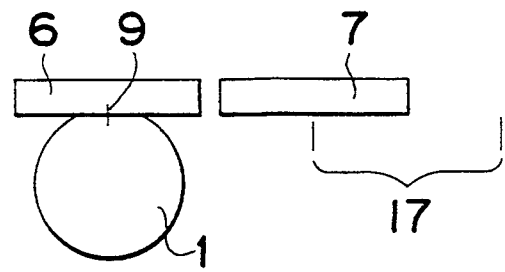
FIGS. 7(a) and 7(b) are views illustrating another embodiment of a conventional parts supply method.
Figure 7B:
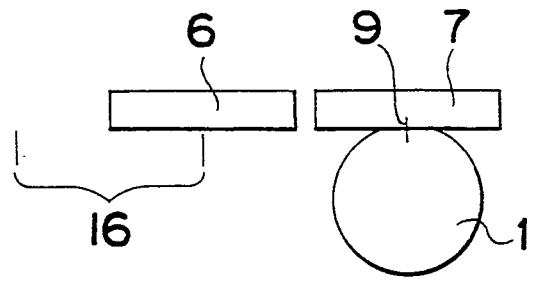

The parts supply apparatus in the present embodiment is the same as that shown in FIG. 4. A plurality of parts supply tables 8 are set respectively on two supply tables, i.e., a left supply table 6 and a right supply table 7. In the present embodiment, the spaced apart interval between the supply tables 6 and 7 is not allowed to be given interval or less.

In the present embodiment, in a case where the interval between a supply table not in use and a supply table in use for a plurality of successive parts supply operations will be restored to a given interval, unnecessary movement of the supply table not in use is avoided.

FIG. 1 shows a flow chart of the movement control for effecting such an operation. At a step 18, information indicative of a given number of parts supply operations immediately after a specified time is retrieved so as to predict, in a step 19, the necessary movement of a supply table to be used during the given number of parts supply operations. Then, a judgment of the relative movement of the supply tables is effected at steps 20 through 22. In particular, at step 20, processing regarding the relative movements of the supply tables is bypassed when it is judged that a supply table need not be moved during the parts supply operations. At step 21, both supply tables are caused to be moved so as to retain the given interval when it is judged that the interval between the supply tables is predicted to be the given interval or less at the specified time. At step 22, a judgment is made as to whether the interval between the supply tables will become the given interval or less after the given number of parts supply operations. If the interval is judged to become the given interval or less, it is determined that movement of the supply table other than the supply table to be used would be unnecessary during the parts supply operation. If the interval is judged not to become the given interval or less, both tables are caused to be operated so as to narrow the interval between the supply tables to be used and the other supply table to the given interval. At step 23, only the supply table to be used or both supply tables are moved in accordance with the above described judgements. Thereafter, at the step 24, the parts supply operation is effected. In accordance with the judgment of step 25, the above described processing is repeated until all parts supply operations are complete.

Figure 2:
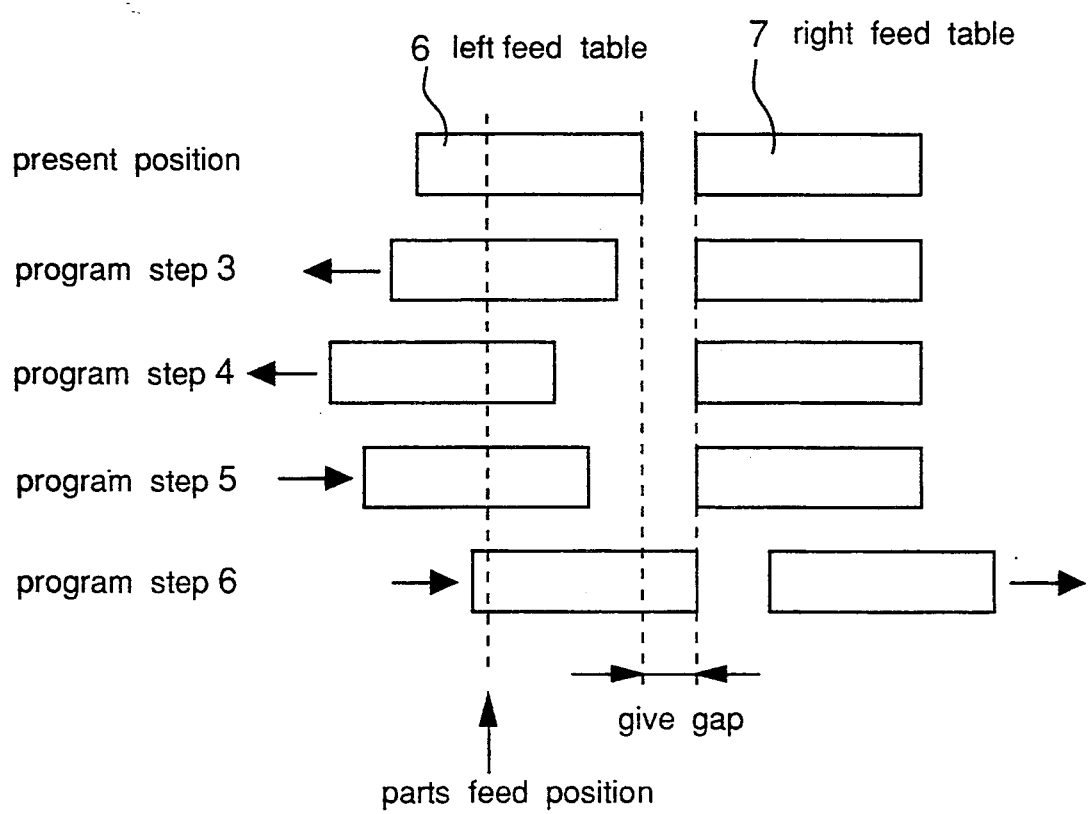
FIG. 2 is a chart for illustrating the operational position of both supply tables.

FIG. 2 shows one embodiment of an actual supply table operation in accordance with the flow chart. In the above described embodiment, the process immediately after the specified time is effected from the step 3 of FIG. 2. In this case, the interval between the supply tables exceeds the given interval from the specified time at step 3 and subsequent thereto and is less than the given interval at step 4. Between step 3 and step 5, movement of the right supply table 7 is judged to be unnecessary and the right supply table 7 does not move. As the interval between the supply tables is less than the given interval at a program step 6, the right supplying table 7 is moved to the right so as to retain the given table interval.

Figure 3A:
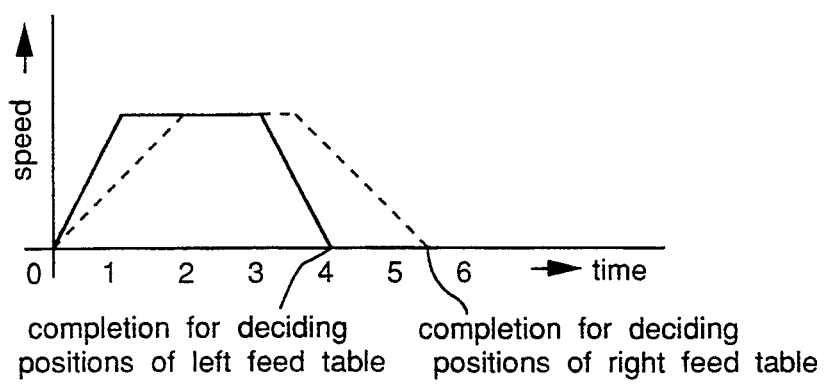
FIGS. 3(a) and 3(b) are charts illustrating moving speed curve lines and positions of both supply tables in a second embodiment of a parts supply method of the present invention.
Figure 3B:
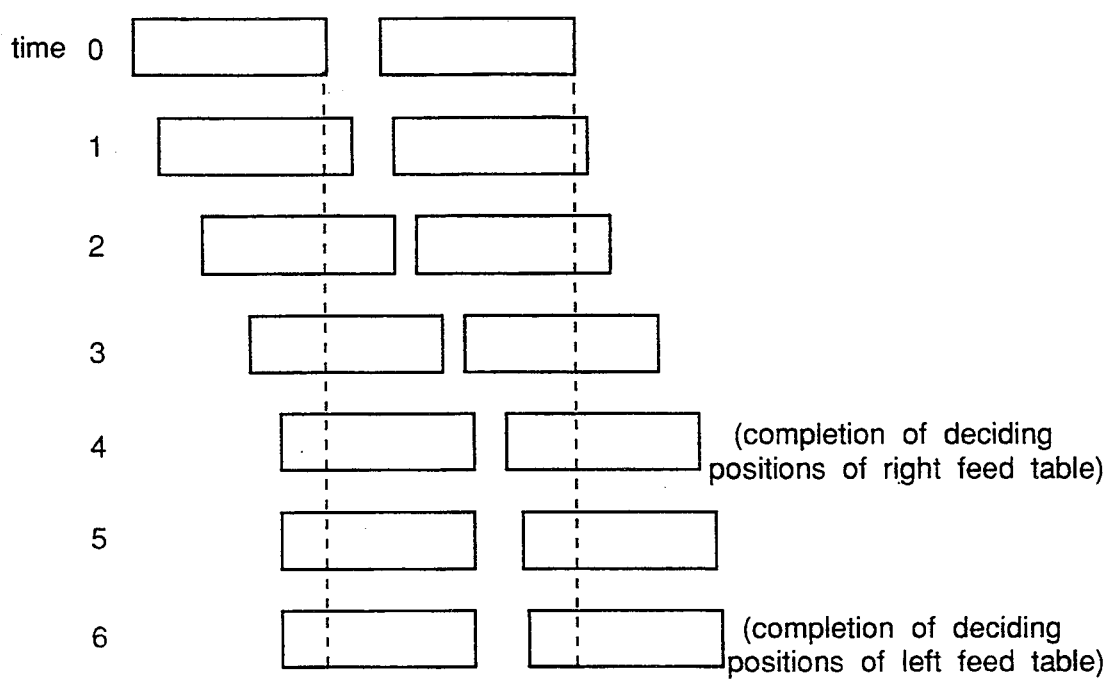

FIGS. 3(a) and 3(b) show a second embodiment of the present invention. In this embodiment, the same interval is maintained with the acceleration of the right supply table 7 which is not used being made half the acceleration of the left supply table 6 which is used. FIG. 3(a) depicts a moving speed curve line, and FIG. 3(b) shows the moving positions. While both supply tables 6 and 7 start moving at the same time, the difference in acceleration causes the tables 6 and 7 to stop at different times. The impact vibrations upon stopping the supply table movement are thereby moderated as compared with a case where both supply tables 6 and 7 stop at the same time.

As is clear from the foregoing descriptions, according to the parts supply method of the present invention, the supply table which is used to effect the parts supply operation and the supplying table which is not used to effect the parts supply operation are both moved so that switching over between the supplying tables can be carried out in a short time period, and the moving position of the supply table which is used to effect a plurality of parts supplying operations to be carried out after a specified time point is predicted. Considering the position of the supply table which effects the obtained parts supply operation and the position at the time point of the supply table which does not effect the parts supply operation, the respective supply tables are moved so that the unnecessary movement of the supply table not used can be avoided and vibrations accompanied by the unnecessary movement can be reduced.

According to the second embodiment of the present invention, the supply table which is used to effect the parts supply operation and the supply table which is not used to effect the parts supply operation are both moved so that the supply tables can be switched over in a short time period. However, the acceleration movement of the supply table which is not used effect the parts supply operation is made relatively small so that the impact vibrations can be reduced.

What is claimed is:

1. A part supply method for controlling a parts supply apparatus having at least adjacent first and second parts supply tables which are spaced apart from each other along a moving direction and which are capable of being moved independently of one another in the moving direction, each of said first and second parts supply tables for setting therein a plurality of adjacent parts supply units, the parts supply apparatus further having a drive device for selectively moving each first and second parts supply table in the moving direction so as to position a desired parts supply unit at a parts take out position to permit parts contained in the desired supply unit to be extracted using an extracting mechanism, wherein, during each of plural successive parts supply operations of said parts supply apparatus, parts are extracted by the extracting mechanism from a parts supply unit position at the parts take out position by movement of one of said first and second parts supply tables, said method comprising:

a first step of determining in advance, based on previously prepared parts supply information, a movement of said first parts supply table during a plurality of successive parts supply operations in which parts are respectively extracted from a plurality of parts supply units of only said first parts supply table;

a second step of determining in advance a movement of said second parts supply table during said plurality of successive parts supply operations, said second step including (a) determining, for each of the plurality of successive parts supply operations, an interval between a current position of said second parts supply table and a position of said first parts supply table determined in said first step, and (b) setting, for each of the plurality of successive parts supply operations, the position of the second parts supply table so as to obtain a given interval between the first and second parts supply tables when the determined interval between the current position of said second parts supply table and the position of said first parts supply table is less than the given interval, and so as to establish the current position of the second parts supply table as the set position of the second parts supply table when the interval between the current position of the second parts supply table and the first supply table is more than the given internal, wherein an unnecessary movement of the second parts supply table is avoided by establishing the current position of the second parts supply table as the set position of the second parts supply table when the interval between the current position of the second parts supply table and the first supply table is more than the given internal; and, a third step of effecting the plurality of successive parts supply operations in accordance with the advance determined movements of the first and second supply tables.

* * * * *